United States Patent [19]
Bajka et al.

[11] Patent Number: 4,465,014
[45] Date of Patent: Aug. 14, 1984

[54] APPARATUS FOR APPLYING SOLDER TO A PRINTED-CIRCUIT BOARD

[75] Inventors: Imre Bajka, Niederglatt; Robert Furrer, Zurich, both of Switzerland

[73] Assignee: Siemens Aktiengesellschaft Berlin & München, München, Fed. Rep. of Germany

[21] Appl. No.: 433,686

[22] Filed: Oct. 12, 1982

[30] Foreign Application Priority Data

Oct. 22, 1981 [CH] Switzerland .................. 6744/81

[51] Int. Cl.³ ........................... B05C 5/02; B05C 3/10
[52] U.S. Cl. ................................... 118/114; 118/410; 118/404; 228/37
[58] Field of Search ............... 118/74, 404, 410, 659, 118/660, 114, 116, 121; 228/21, 22, 23, 37

[56] References Cited

U.S. PATENT DOCUMENTS

| | | | |
|---|---|---|---|
| 2,993,272 | 7/1961 | Carlzen et al. | 29/503 |
| 3,119,363 | 1/1964 | Rieben | 118/410 X |
| 3,710,759 | 1/1973 | Tardoskegyi et al. | 118/410 X |
| 3,724,418 | 4/1973 | McLain | 228/37 X |
| 3,989,180 | 11/1976 | Tardoskegyi | 228/180 R |

FOREIGN PATENT DOCUMENTS

322944  8/1974  Australia.
0013359  7/1980  European Pat. Off..

*Primary Examiner*—John P. McIntosh
*Attorney, Agent, or Firm*—Werner W. Kleeman

[57] ABSTRACT

The solder applying apparatus enables applying solder to both sides or faces of printed-circuit boards travelling essentially in horizontal direction through a production or manufacturing line, and which circuit boards are not yet equipped with electrical components or the like. The apparatus contains a solder applicator means or device where liquid solder is pumped from a supply container in such a quantity that a solder wave forms over an outlet or discharge opening of the applicator device. This solder wave extends beyond the feed or transport plane of the printed-circuit boards. At the side walls of the applicator solder device there are mounted guide elements formed of metal plating or sheet metal which extend beneath the feed plane, the solder flowing-off by means of such guide elements. The angle of inclination of the metal guide elements is adjustable with respect to the feed plane. Also the spacing between the discharge opening of the applicator solder device and the feed plane is variable. Directly above or below, as the case may be, the feed plane there are arranged substantially cylindrical-shaped elements at the inlet side and the outlet side where the printed-circuit boards respectively inbound and outbound from the solder applying apparatus. These cylindrical-shaped elements are disposed at the regions of the ends of the guide elements and extend transversely with respect to the direction of feed or advance of the printed-circuit boards. These cylindrical-shaped elements function, on the one hand, as solder strippers or scrapers and, on the other hand, as limiting means for the solder blanket which during the through-passage of a printed-circuit board tends to spread-out at the upper surface or face thereof.

12 Claims, 5 Drawing Figures

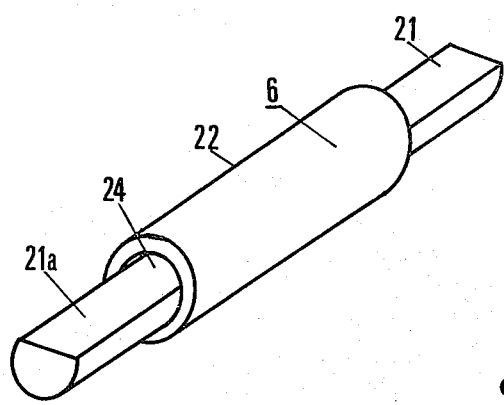
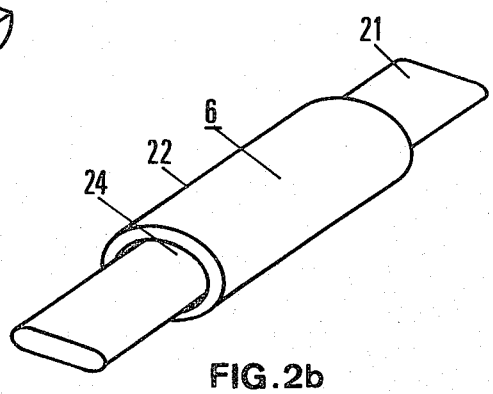
FIG.2a   FIG.2b
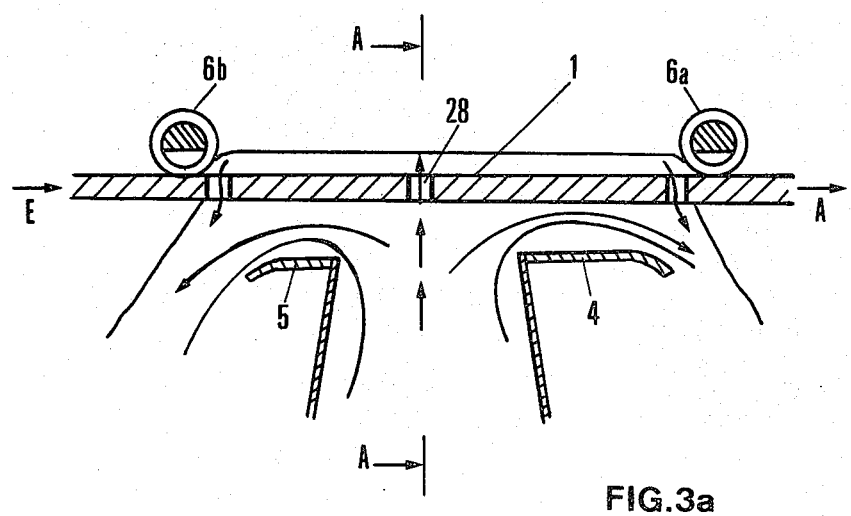
FIG.3a
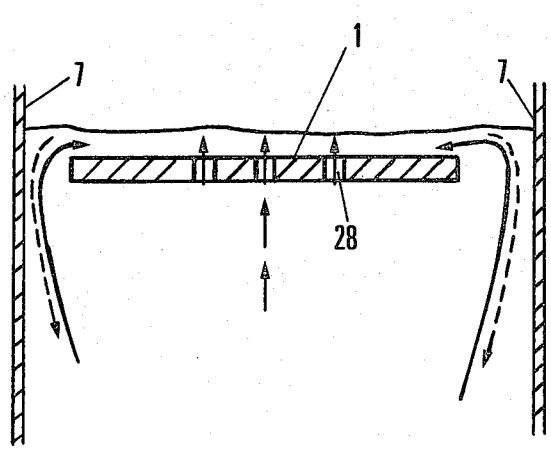
FIG.3b

APPARATUS FOR APPLYING SOLDER TO A PRINTED-CIRCUIT BOARD

BACKGROUND OF THE INVENTION

The present invention relates to a new and improved construction of apparatus for applying solder to different circuit boards, generally referred to herein broadly as simply printed-circuit boards.

In its more particular aspects, the apparatus for the application of a solder layer or covering to the metalized surfaces of a horizontally advanced printed-circuit board, utilizes a supply container or receptacle containing molten solder and a substantially chimney-like solder applicator structure or solder applicator device which protrudes out of such supply container. The solder is upwardly pumped out of the supply container through the solder applicator device in such a manner that a wave of liquid solder is formed over an outlet or discharge opening of the solder applicator device which is directed into contact with the printed-circuit board. At the upper edge of both of the side walls of the solder applicator or applying device, and which side walls extend transversely with respect to the feed or advance direction of the printed-circuit boards, there are arranged guide elements formed of metal plating or sheet metal. These guide elements can be adjusted as to their angle of inclination with respect to the feed plane of the printed-circuit boards which extends at a certain spacing above the discharge opening of the solder applicator device, the solder of the solder wave flowing back by means of these guide elements into the supply container.

A soldering apparatus of the aforementioned type is disclosed in U.S. Pat. No. 2,993,272, granted July 25, 1961, and serves for soldering electrical components to printed-circuit boards. The circuit boards which contain the electrical components are continuously horizontally guided over the solder wave and the bottom face or underside of such circuit boards along with the terminals of the electrical components are coated with solder. During the fabrication of circuit boards for printed-circuits it is advantageous to provide, prior to the mounting of the electrical components, a protective solderable coating at the metallic surfaces appearing at both the top and bottom faces of the circuit boards and also at the bore or drill holes, and thus, to improve the shelf life properties thereof and to also prepare the circuit boards such that their soldering properties are enhanced.

In European Patent Application No. 1-0013359 there is disclosed an apparatus which renders possible, during horizontal passage of the circuit boards, the application of a solder layer into the bore or drill holes and also to both faces of a circuit board which is not yet equipped with the electrical components, in contrast to the heretofore known technique of vertically immersing the circuit boards into a molten solder bath. This equipment consists of a first container from which liquid solder is pumped into a second container in such a quantity that there is formed in the second container a solder bath level which continuously lies above horizontally extending slot-shaped openings. These slot-shaped openings are provided at oppositely situated walls of the second container and are located in the feed or advance plane of the printed-circuit boards. The printed-circuit boards which are to be equipped with the electrical components are displaced by means of the slot-shaped openings through a static column of liquid solder and thus coated with solder.

SUMMARY OF THE INVENTION

It is a primary object of the present invention to provide a new and improved construction of apparatus for applying solder to printed-circuit boards or the like in a manner such that it can be incorporated into an automated production of manufacturing line working with essentially horizontal passage or travel of the printed-circuit boards and allows for faultless application of the solder layer, in a manner complying with present day quality requirements, to both faces of the printed-circuit boards which do not yet contain the electrical components and also ensures for as uniform as possible coating of the through-metalized bore or drill holes of the printed-circuit boards.

Still a further significant object of the present invention is directed to a new and improved construction of apparatus for the application of solder to circuit boards, which apparatus is relatively simple in construction and design, quite economical to manufacture, extremely reliable in operation, not readily subject to breakdown or malfunction, requires a minimum of maintenance and servicing, and allows for high-quality deposition of the solder upon the circuit boards.

Now in order to implement these and still further objects of the invention, which will become more readily apparent as the description proceeds, the solder applying apparatus of the present development is manifested by the features that the solder wave possesses a height which exceeds the feed or travel plane of the printed-circuit boards. Both of the metallic guide elements extend at least partially approximately parallel to the mentioned feed plane. At the inlet side and at the outlet side of the apparatus, that is at the side where the printed-circuit boards or the like enter and exit, respectively, from the solder applying apparatus, and specifically at the region of the ends of the guide elements there are arranged directly over the feed plane elements which extend transversely to the direction of feed or advance of the printed-circuit boards. These elements, during passage of the printed-circuit boards, bear against the latter and, on the one hand, define a boundary or confinement for the solder blanket at the inlet side and at the outlet side, respectively, which tends to spread out upon the upper surface or face of the printed-circuit board during through-passage thereof, and, on the other hand, act as scraper or stripper means at the surface of the printed-circuit boards.

One of the more notable advantages of the present development resides in the fact that, through the use of relatively simple means and with correspondingly modest equipment expenditure there can be usefully employed the known principle of solder wave soldering for the present day requirements as concerns coating of printed-circuit boards at both sides or faces thereof as well as coating of the metalized inner walls of the bore or drill holes with solder. By virtue of the intensive flushing of the bore or drill holes with solder in both directions, which is continuously positively brought about during the entire through-pass of the printed-circuit boards, there is attained an outstanding coating of the drill holes or bores both internally thereof and at their marginal zones at both faces or sides of the circuit boards. The continuously produced friction effect by virtue of the completely effective solder wave, which prevails between the liquid solder and the metallic surfaces additionally causes an optimum wetting or imbuing of the surfaces. By specially constructing the elements which contact the through-passing printed-circuit boards and which act both as solder scrapers or strippers and also as limiting means for the solder, there is extensively prevented any retention of flux agent residues at the surfaces of the circuit boards.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 2a illustrates a first possible construction of an element used in the solder applying apparatus of FIG. 1 and serving for limiting and scraping of solder upon the printed-circuit boards;

FIG. 2b illustrates a second construction of such solder limiting and scraper element, likewise usable in the arrangement of FIG. 1;

FIG. 3a schematically illustrates in longitudinal sectional view a portion of the solder applying apparatus shown in FIG. 1 and serving to explain the function thereof; and FIG. 3b is a cross-sectional view of the arrangement of FIG. 3a, taken substantially along the line A—A thereof.

DETAILED DESCRIPTION OF THE PREFERRED EMBODIMENTS

Figure 1:
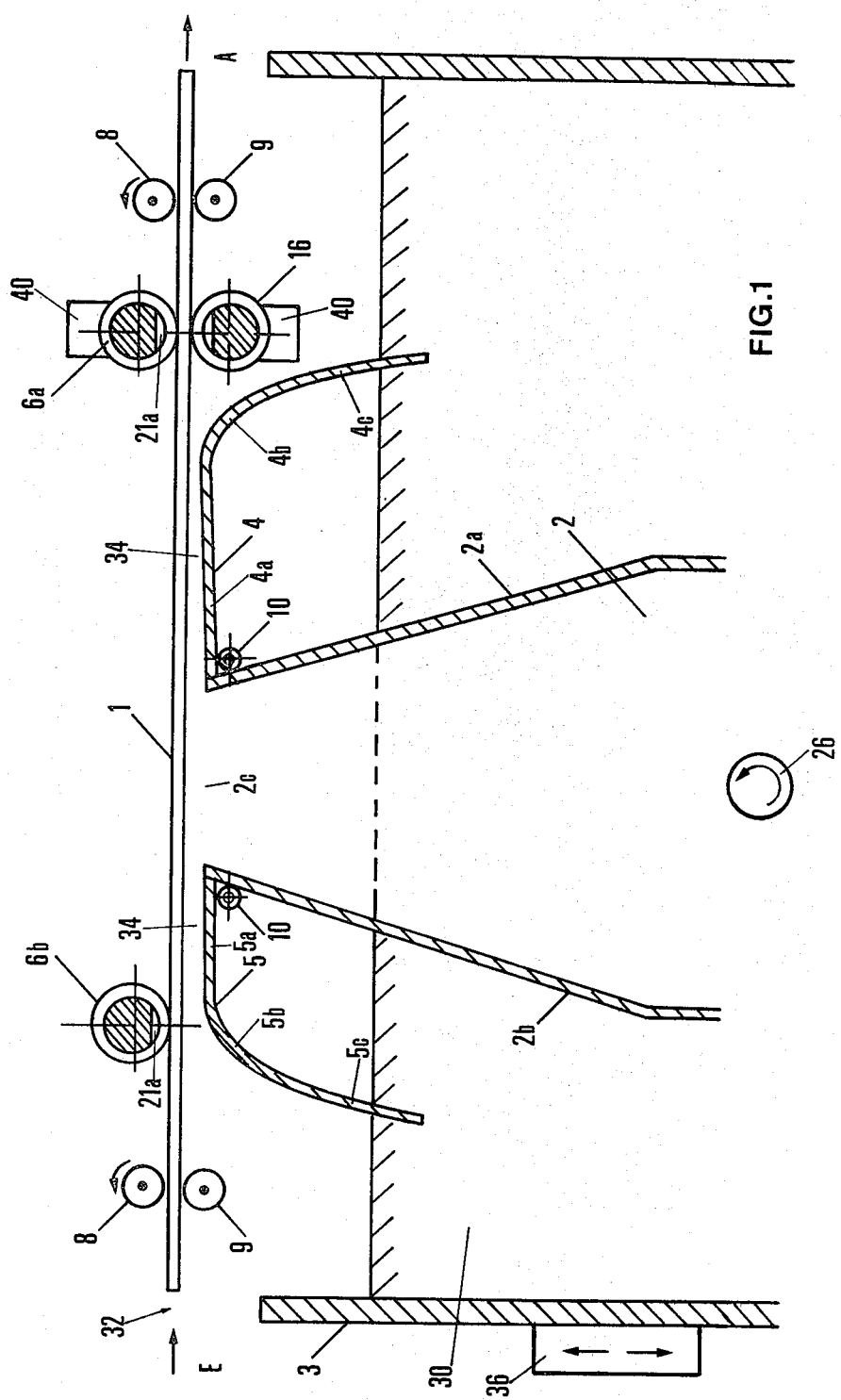
FIG. 1 schematically illustrates a solder applying apparatus constructed according to the invention and specifically depicts the more essential components thereof in sectional view.

Describing now the drawings, it is to be understood that only enough of the construction of the solder applying apparatus has been shown therein as will enable those skilled in the art to readily understand the underlying principles and concepts of the present development, while simplifying the illustration of such drawings. Turning attention now specifically to the arrangement of solder applying apparatus as depicted in FIG. 1, it will be seen that such comprises a supply container or receptacle 3 which contains molten solder which is maintained by any suitable and therefore not particularly shown heating device at the required temperature as is well known in this technology. Within the solder container 3 there is arranged an upwardly open, substantially chimney-like configured solder applicator device or structure 2 which protrudes out of the solder bath, generally indicated by reference character 30. This solder applying or applicator device 2 has at its upper end a discharge or outlet opening 2c through which there effluxes the solder in the direction of the printed-circuit boards 1 passing thereabove. Both the solder applicator device 2 and also the supply container 3 have only been partially shown in FIG. 1. The feed or travel plane, generally indicated by reference character 32, of the printed-circuit boards 1 which are to be coated at both sides or faces with a respective solder layer or coating, is located at a predetermined distance above this discharge or outlet opening 2c of the solder applicator device 2. The printed-circuit boards 1 which have previously been imbued at both faces with a suitable flux agent or the like and pre-heated are transported from the inlet or entry side E at a predetermined velocity in the direction of the outlet or exit side A of the arrangement, i.e. from the side E where the printed-circuit boards 1 enter the operative region of the solder applying apparatus to the oppositely situated outlet side A where the printed-circuit boards, following application of the solder thereto, depart from the operative region of such solder applying apparatus.

The feed or travel movement imparted to the printed-circuit boards 1 can be accomplished by any suitable known conveying or transport facilities which, in the illustrated exemplary embodiment, are constituted for instance by means of pairs of feed rolls 8, 9 located, respectively, at the region of the inlet side E and the outlet side A, and preferably a respective roll of each roll pair 8, 9 are synchronously driven. These feed rolls 8, 9 can extend over the entire width of the printed-circuit boards 1 or, however, can only engage discrete portions of the printed-circuit boards 1, for instance can engage the marginal or edge regions thereof. The number of pairs of such feed or transport rolls 8, 9 arranged at the respective inlet side E and outlet side A is dependent upon the maximum length of the printed-circuit boards 1 which are to be processed, and specifically, is to be chosen such that each of the printed-circuit boards 1 remains within the feed or travel plane 32 throughout the entire time of passage of the printed-circuit boards 1 through the effective region of the solder applying apparatus. For the purpose of accommodating the equipment to different thicknesses of the printed-circuit boards 1 at least one of both rolls of each of the roll pairs 8, 9 can be appropriately displaceably arranged in a direction essentially perpendicular to the feed or travel plane 32.

At the upper edge of those side walls 2a and 2b of the solder applicator device 2 which extend transversely with respect to the feed or advance direction of the printed-circuit boards 1 there is pivotably or rotatably mounted a respective guide element 4 and 5, formed of sheet metal or metal plating. The width of such guide elements 4 and 5 approximately corresponds to the width of the related side walls 2a and 2b. The discharge or outlet opening 2c of the chimney-like applicator device or structure 2, viewed in the transverse direction, is at least as long as, and in the exemplary embodiment under discussion, preferably longer than the maximum width of the printed-circuit boards 1 which are to be processed. The plane containing at least the straight portions 4a and 5a of the guide elements 4 and 5 extends approximately parallel to the feed or advance plane 32 of the printed-circuit boards 1. The ends or end portions 4c and 5c of the sheet metal guide elements or guides 4 and 5 are preferably downwardly bent or flexed, i.e. are bent so as to extend towards the interior of the supply container or receptacle 3, in order to ensure for a clean return flow of the solder back into the confines of the supply container or receptacle 3.

The straight or linear portion 5a of the metallic guide element 5 which confronts the inlet or entry side E of the arrangement and which extends approximately parallel to the feed or advance plane 32 of the printed-circuit boards 1, in the exemplary embodiment under discussion, is shorter than the corresponding straight or linear portion 4a of the other metallic guide element 4 which confronts the outlet or delivery side A, something which however is not crucial as far as the teachings of the invention is concerned. Equally, as will be apparent from FIG. 1 the height of the side walls 2a and 2b differs from one another, again a feature which, however, is not crucial for the faultless functioning of the equipment. The angle of inclination of the guide elements 4 and 5 with respect to the feed or travel plane 32 of the printed-circuit boards 1 can be selectively adjusted by means of any suitable adjustment and arresting devices 10 which can be displaced upwardly and downwardly along the side walls 2a and 2b. Of course, any other appropriate adjustment means for varying the inclination of the guide elements or plates 4 and 5 can be utilized. In this way there can be selectively altered, as desired, the size of the intermediate spaces 34 between the guide elements 4 and 5 and the printed-circuit boards 1. Additionally, the supply container 3 together with the solder applicator device 2 can be displaced in substantially vertical direction relative to the feed or transport plane 32 by any suitable displacement or adjustment facility, as generally indicated by the displacement or adjustment mechanism 36 shown in FIG. 1. For instance, this displacement or adjustment mechanism 36 can constitute a suitable hoisting device or can be representative of an elevationally displaceable table or platform upon which the supply container 3 and its related parts are supported. The arrangement shown in FIG. 1 containing the metallic guide elements 4 and 5 of different length and which slightly ascend with respect to the feed or travel plane 32 in the direction from the inlet side E to the outlet or delivery side A, has been found to be extremely advantageous in practice.

Directly above the feed or travel plane 32 of the printed-circuit boards 1 there are arranged above or at least at the neighborhood of the bending or flexure locations 4b and 5b of the metallic guide elements 4 and 5, respectively, substantially cylindrical-shaped elements or members 6a and 6b which extend transversely, for instance perpendicular to the feed or travel direction of the printed-circuit boards 1. The cylindrical element 6b which is arranged above the solder wave at the region of the inlet or entry location E of the printed-circuit boards 1, serves for limiting the solder blanket or the like formed upon the top surface of the printed-circuit boards 1 during through-passage of each such printed-circuit board, whereas the other cylindrical element 6a, apart from limiting or confining the solder blanket at the outlet side or location A, additionally serves for stripping or scraping the solder and a portion of the flux agent residues from the printed-circuit board 1 emerging from the solder applying apparatus.

As to the details of these elements 6a and 6b reference now will be made to FIGS. 2a and 2b, wherein these elements in each case have been here merely generally designated by reference character 6. As shown in FIG. 2a the element 6 can consist of a core 21 and a jacket or outer shell 22. The cross-section of the core 21, as best seen by referring to FIG. 2a, possesses the shape, for instance, of a circular segment, whereas the jacket or outer shell 22 has the shape, for instance, of a circular or ring-shaped cross-section configuration. The jacket 22 is mounted upon the core 21 in such a fashion that it can freely rotate thereupon. This core 21 preferably consists of metal, for instance steel. The jacket or outer shell 22 preferably consists of a permanently elastic, heat-resistant material, preferably is formed of a suitable plastics material.

By virture of the different cross-sectional shapes of the jacket 22 and core 21 there is formed therebetween a hollow space or compartment 24 which is effective as an air cushion. The core 21 of the element 6 is rigidly connected in the solder applying apparatus, and specifically in such a manner that the hollow space or compartment 24 confronts the feed or travel plane 32 of the printed-circuit boards 1, i.e. the planar or flat surface 21a of the core 21 is located substantially parallel to the feed plane 32 of the printed-circuit boards 1 and this core 21 can expand at least in one direction along its lengthwise axis when subjected to thermal effects. The jacket or outer surface 22, in turn, can freely expand in all directions. Of course, it is possible to form the hollow space or compartment 24 by using a multiplicity of different cross-sectional shapes of the core 21 and the jacket 22.

A further possible construction of the element 6 has been depicted in FIG. 2b, wherein the core 21 possesses an elliptical-like cross-sectional configuration, and the jacket or outer shell 22 is constructed such that between such jacket 22 and the core 21 there is formed the hollow space or compartment 24.

During operation of the solder applying apparatus depicted in FIG. 1 there is automatically turned-on a suitable schematically indicated pump 26 (FIG. 1) as soon as a printed-circuit board 1 or the like arrives at the region of the inlet location or entry side E of the arrangement. Consequently, liquid solder is upwardly conveyed or pumped within the solder applicator device or structure 2. This pump 26 is again automatically turned-off as soon as the printed-circuit board 1 has departed from the region of the outlet or delivery location A. The upwardly emerging solder forms over the discharge opening 2a of the solder applicator device 2 a solder wave or splash which exceeds or extends beyond the circuit board-feed or travel plane 32, and the propagation of which in the direction of the inlet side E and the outlet side A above the feed plane 32 is limited by the confining or limiting elements 6b and 6a, this solder wave then flowing-off by means of the metallic guide elements 4 and 5. As soon as the printed-circuit board 1, after entry at the inlet location E, has reached the operable zone or region of the element 6b and that of the metallic guide element 5, this circuit board is initially brought into contact at its underside or face with the hot solder wave, then penetrates through the solder wave which is dammed-up by the element 6b and is continuously heated during the progressive feed or advance movement of such circuit board 1. With optimum geometric arrangement of the metallic guide elements 4 and 5 in relation to the feed or travel plane 32 of the printed-circuit boards 1 there is achieved the beneficial result that the inserted printed-circuit board 1 is exposed to the action of a non-symmetrical solder wave or the like. The arrangement can be optimized by carrying out three measures, namely:

(1) By adjusting the inclination angle of the metallic guide elements 4 and 5 with respect to the feed plane 32;

(2) By selecting an appropriate height of the side walls 2a and 2b, and thus, the spacing of the rotational axes of the sheet metal guides 4 and 5 from the feed plane 32; and (3) By vertically displacing the supply container 3 along with the solder applicator device 2 relative to the feed or travel plane 32.

It is possible to determine and optimize the quantity of solder which comes into contact with the underside or bottom face of the printed-circuit board 1 by means of, on the one hand, the pump output or delivery capacity and, on the other hand, the spacing of the upper end of each of the side walls 2a and 2b with respect to the feed or travel plane 32. Additionally, the flow velocity of the solder, especially at the bottom face of the printed-circuit boards 1, can be influenced by altering the angle of inclination of the metallic guide elements 4 and 5. In this way there also can be influenced the outflow velocity of the solder blanket which forms at the upper surface or face of the printed-circuit boards 1. By optimizing such influencing parameters there is produced the aforementioned non-symmetrical solder wave, wherein the quantity of the solder flowing towards the inlet location E is greater than the quantity of solder flowing towards the outlet location A. Hence, each inserted printed-circuit board 1, already at the incipient phase of its travel through the solder applying apparatus is exposed, on the one hand, to the greatest possible friction between the liquid solder and, on the other hand, there is inputted thereto a sufficiently great amount of thermal energy in order to ensure for the best possible imbuing of the metalized surfaces with solder. The liquid solder, during the further advance movement of the printed-circuit board 1, additionally passes both laterally and also through the bores 28 (FIGS. 3a and 3b) of the printed-circuit board 1 in such a quantity onto the upper surface of such printed-circuit board that there is formed at that location a coherent solder blanket or covering, the expanse of which is limited by both of the elements 6a and 6b.

In FIGS. 3a and 3b there have been more specifically depicted the flow conditions of the solder. From the sectional view of FIG. 3b there is particularly evident the lateral flow of the solder onto and from the top face or upper surface of the printed-circuit board 1. The lateral limiting of the solder wave is accomplished at both sides by means of the side walls 7. The flushing of the bores or drill holes 28 in vertical direction, both from above and from below, ensures for their faultless coating with solder in the event that these bores or drill holes 28 are through-metalized. The solder which flows-off over the metallic guide elements 4 and 5 produces a suction action which enhances the flushing-through of the bores or drill holes 28 with the solder. The continuous flushing action ensures for a complete expulsion of the air out of these drill holes or bores 28, something having an advantageous effect upon the coating of the inner walls of these drill holes 28. In this way there is formed a so-to-speak "dynamic" solder blanket or cover, so that all of the free metalized surfaces are continuously exposed at both sides or faces to a frictional action by virtue of the applied solder, enhancing the optimum coating of the printed-circuit boards 1. The metallic guide element 4 located at the exit or outlet side A ensures for retention of the thermal energy which is inputted to the printed-circuit board by the solder which flows away over the metallic guide element 4, which augments the good wetting of the metalized surfaces with solder.

The length of the guide section 4a extending approximately parallel to the feed or advance plane 32 therefore is essentially dependent upon the expanse of the solder blanket in the direction of the outlet or exit side A which is governed by the arrangement of the element 6a. It is basically possible for both of the metallic guide elements 4 and 5 to possess a random length which is accommodated to the momentarily encountered conditions.

As explained, the element 6a, apart from delimiting the solder blanket, additionally assumes the function of stripping-off the solder from the printed-circuit board 1. By virtue of the air cushion 24 the elements 6a and 6b optimumly accommodate themselves over their entire length to the surface of the printed-circuit board and prevent the outflow of the solder blanket over the predetermined boundaries at the printed circuit board 1. In order to initiate a stripping or scraping away of the solder also at the bottom face of the printed-circuit board 1, there can be provided an additional cylindrical-shaped scraper or stripper element 16 beneath the feed or travel plane 32 of the printed-circuit board 1. This arrangement is carried out advantageously directly beneath the element 6a, as shown, and both of the elements 6a and 16 contact the through-passing printed-circuit boards 1. In the event that there are processed circuit boards of different thickness, then it is advantageous if at least one of both elements 6a and 16 is arranged so as to be appropriately automatically displaceable or else is fixedly adjustable in a direction perpendicular to the feed or travel plane 32, and which adjustment structure or facilities have been generally indicated by reference character 40 at the right-hand portion of FIG. 1. It is here particularly pointed out that any suitable adjustment device, such as spindle adjustments, power-operated adjustment elements and so forth can be used. During forward advance of the printed-circuit boards 1, depending upon the thickness of these printed-circuit boards 1, these elements 6a and 16 can be appropriately spaced from one another, and thus, contact the lower and upper faces of the printed-circuit baords 1 without however losing their delimiting or constraining effect for the solder blanket. The feed or advance force for the transport of the printed-circuit boards 1 can be reduced if the elements 6a, 6b and 16 are not arranged exactly in a direction perpendicular to the feed direction, rather are oriented in a direction enclosing a small angle with respect to the vertical direction.

While there are shown and described present preferred embodiments of the invention, it is to be distinctly understood that the invention is not limited thereto, but may be otherwise variously embodied and practiced within the scope of the following claims.
ACCORDINGLY,

What we claim is:

1. Apparatus for the application of a solder layer to metalized top and bottom surfaces of essentially horizontally advanced circuit boards, comprising:
   a supply container for molten solder;
   said supply container having an inlet side and an outlet side for the respective entry and exit of through-passing circuit boards to which there is to be applied the solder;
   a solder applicator device having a discharge opening and arranged within said supply container and protruding therefrom in the direction of a predetermined feed plane through which travel the circuit boards;
   means for delivering the solder out of the supply container into the solder applicator device such that a liquid solder wave is formed at said discharge opening of said solder applicator device;
   said solder applicator device containing side walls having upper edges;
   said side walls being disposed transversely with respect to the direction of travel of the circuit boards;
   metallic guide elements arranged at the region of the upper edges of said side walls;
   said guide elements possessing an adjustable angle of inclination with respect to said feed plane which extends at a certain spacing above said discharge opening of said solder applicator device;

the solder of the solder wave flowing over the guide elements back into the supply container;

said solder wave possessing a height which exceeds the feed plane of the circuit board;

both of said guide elements having ends and possessing guide element portions extending at a preselectable distance and at least approximately parallel to said feed plane and defining an intermediate space between said guide elements and said circuit board when passed through said apparatus;

solder limiting elements arranged to extend transversely with respect to the direction of feed of the circuit boards;

said solder limiting elements being arranged at the region of the inlet side and the outlet side at the region of the ends of the metallic guide elements and directly above the feed plane;

said solder limiting elements, during passage of the circuit boards, bearing upon said circuit boards; and said solder limiting elements serving as limiting means for a solder blanket forming between the inlet side and at the outlet side upon the circuit boards and which solder blanket spreads out upon the upper surface of the circuit boards during through-passage thereof and at least one of which limiting elements also acts as stripper means for stripping solder from the upper surface of the circuit boards; and said solder wave, after entry of said circuit board, being deformed thereby to continuously flow around and wet all sides of the part of the circuit board which is located between said limiting elements by virtue of solder laterally passing to said top surface of said circuit board and laterally returning past said circuit board and with said solder simultaneously wetting said bottom surface of said circuit board by virtue of solder exiting from said discharge opening and filling said intermediate space defined by said circuit board and said guide elements.

2. The apparatus as defined in claim 1, further including:

an additional solder limiting element arranged at the region of the outlet side at the region of an end of the related guide element and directly below the feed plane; and said additional solder limiting element bearing against the circuit boards upon through-passage thereof.

3. The apparatus as defined in claim 2, further including:

means for adjusting at least one of the solder delimiting elements located at the region of the outlet side in a direction substantially perpendicular to the feed plane of the circuit boards.

4. The apparatus as defined in claim 1, wherein:

the guide elements slightly ascend in a direction from the inlet side to the outlet side by being arranged at a spacing from the feed plane which reduces with respect to the feed plane between the inlet side and the outlet side.

5. The apparatus as defined in claim 4, wherein:

the guide element neighboring the inlet side is shorter than the guide element neighboring the outlet side.

6. The apparatus as defined in claim 1, further including:

means for displacing the supply container in conjunction with the solder applicator device in an essentially vertical direction relative to said feed plane.

7. The apparatus as defined in claim 1, wherein:

said solder applicator device possesses a substantially chimney-like configuration.

8. The apparatus as defined in claim 1, wherein:

said printed circuit board is provided with holes; and said solder wave, after entry of said circuit board, being deformed thereby to additionally continuously flow through said holes and to additionally return through said holes.

9. Apparatus for the application of a solder layer upon metalized surfaces of essentially horizontally advanced circuit boards, comprising:

a supply container for molten solder;

said supply container having an inlet side and an outlet side for the respective entry and exit of through-passing circuit boards to which there is to be applied the solder;

a solder applicator device having a discharge opening and arranged within said supply container and protruding therefrom in the direction of a predetermined feed plane through which travel the circuit boards;

means for delivering the solder out of the supply container into the solder applicator device such that a liquid solder wave is formed at said discharge opening of said solder applicator device;

said solder applicator device containing side walls having upper edges;

said side walls being disposed transversely with respect to the direction of travel of the circuit boards;

metallic guide elements arranged at the region of the upper edges of said side walls;

said guide elements possessing an adjustable angle of inclination with respect to said feed plane which extends at a certain spacing above said discharge opening of said solder applicator device;

the solder of the solder wave flowing over the guide elements back into the supply container;

said solder wave possessing a height which exceeds the feed plane of the circuit board;

both of said guide elements possessing guide element portions extending at least approximately parallel to said feed plane;

solder limiting elements arranged to extend transversely with respect to the direction of feed of the circuit boards;

said solder limiting elements being arranged at the region of the inlet side and the outlet side at the region of the ends of the metallic guide elements and directly above the feed plane;

said solder limiting elements, during passage of the circuit boards, bearing upon said circuit boards;

said solder limiting elements serving as limiting means for a solder blanket forming between the inlet side and at the outlet side upon the circuit boards and which solder blanket spreads out upon the upper surface of the circuit boards during through-passage thereof and at least one of which limiting elements also acts as stripper means for stripping solder from the upper surface of the circuit boards;

an additional solder limiting element arranged at the region of the outlet side at the region of an end of the related guide element and directly below the feed plane;

said additional solder limiting element bearing against the circuit boards upon through-passage thereof;

means for adjusting at least one of the solder delimiting elements located at the region of the outlet side in a direction substantially perpendicular to the feed plane of the circuit boards;

each of said solder limiting elements comprising:

a core member;

a jacket surrounding said core member;

said core member being stationary;

said core member and said jacket cooperating with one another to form a hollow space therebetween which is effective as an air cushion; and said hollow space confronting the feed plane.

10. The apparatus as defined in claim 9, wherein:

said jacket is fixedly arranged with respect to the stationary core member.

11. The apparatus as defined in claim 9, wherein:

said jacket is rotatably arranged with respect to said core member.

12. The apparatus as defined in claim 9, wherein:

said core member possesses a substantially circular segment-shaped configuration;

said jacket possesses a substantially circular ring-shaped cross-sectional configuration;

said core member being formed of metal and can expand axially at least in one direction; and said jacket being formed of a permanently elastic heat-resistant plastics material which can freely expand in all directions.

* * * * *